United States Patent [19]

Yan

[11] Patent Number: 5,045,721

[45] Date of Patent: Sep. 3, 1991

[54] ZERO STATIC CURRENT HIGH SPEED TTL COMPATIBLE BUFFER

[75] Inventor: Raymond C. Yan, Daly City, Calif.

[73] Assignee: Teledyne Industries, Mountain View, Calif.

[21] Appl. No.: 324,438

[22] Filed: Mar. 16, 1989

[51] Int. Cl.[5] .................... H03K 17/16; H03K 5/12; H03K 3/26

[52] U.S. Cl. .................... 307/443; 307/451; 307/475; 307/263; 307/279; 307/530

[58] Field of Search ............... 307/443, 451, 475, 530, 307/279, 263; 365/219, 230

[56] References Cited

U.S. PATENT DOCUMENTS

| | | | |
|---|---|---|---|
| 4,354,257 | 10/1982 | Varshney et al. | 365/219 |
| 4,486,670 | 12/1984 | Chan et al. | 307/475 |
| 4,656,374 | 2/1987 | Rapp | 307/451 |

Primary Examiner—Stanley D. Miller
Assistant Examiner—Margaret Rose Wambach
Attorney, Agent, or Firm—Fliesler, Dubb, Meyer & Lovejoy

[57] ABSTRACT

A level discriminating buffer, including a input stage, a latching stage, and a switching accelerator, having an improved response time. The input stage discriminates between logic states of the input signal. The latch stage acts as a logic state latch and further provides transistors in the current paths of the input and latch stages that are non-conducting during each static state of the input signal. The switching accelerator is responsive to the input stage for generating a short period signal to accelerate the logic state switching of the latch stage and thereby improve the response of the output signal to a change in an input signal logic state change.

16 Claims, 3 Drawing Sheets

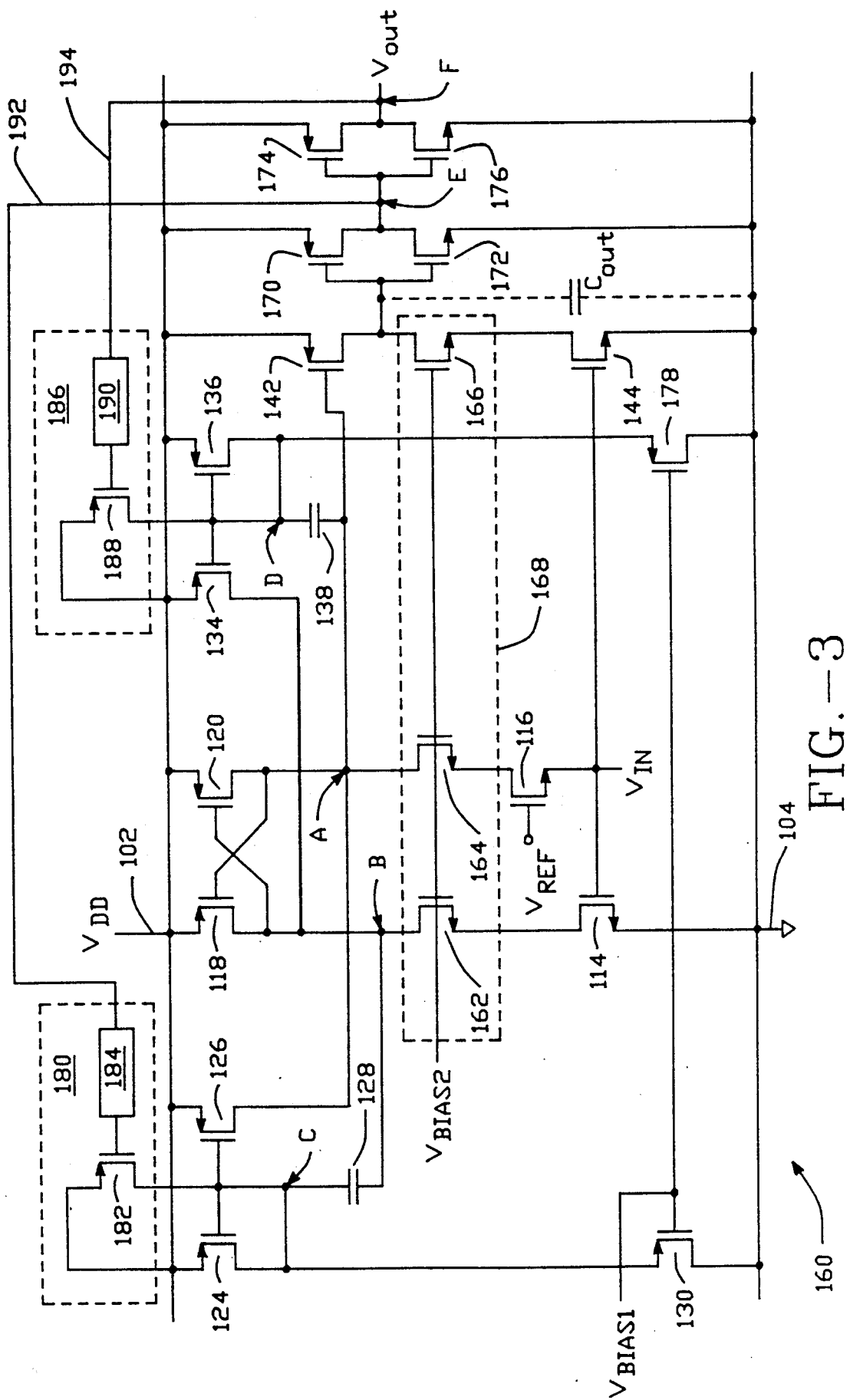
FIG.—3

5,045,721

ZERO STATIC CURRENT HIGH SPEED TTL COMPATIBLE BUFFER

FIELD OF THE INVENTION

The present invention relates generally to a buffer for logic signals. Specifically, the present invention is related to a high-speed, low-power buffer circuit that is capable of discriminating between logic level status of a TTL or other logic family input signal with improved response times.

BACKGROUND OF THE INVENTION

U.S. Pat. No. 4,656,374 discloses, a low power buffer circuit capable of discriminating the levels of an input logic signal. To provide transistor-transistor-logic (TTL) logic family compatibility, the circuit operates about a reference voltage applied to the gate of an insulated gate field effect transistor to establish an input switching threshold for the buffer circuit appropriate for the desired TTL logic family compatibility. Further, configuring the circuit in such a way that for each static state of an input signal, each current path of the circuit has one nonconducting transistor, power dissipation of the buffer circuit is substantially reduced to zero.

However, low power dissipation is not the only requirement that such buffer circuits should desirably meet. With the ever increasing demand for higher operating speed digital circuits, buffer circuits also having very high-speed response characteristics are desired.

SUMMARY OF THE INVENTION

A general purpose of the present invention is therefore to provide a buffer circuit capable of discriminating between the logic levels of an input signal of a predetermined logic family with little or no static power dissipation and having a high speed response characteristic.

This is achieved in the present invention by a level discriminating buffer circuit, including a input stage, a latching stage, and a switching accelerator, having an improved response time. The input stage discriminates between logic states of the input signal. The latch stage acts as a logic state latch and further provides transistors in the current paths of the input and latch stages that are non-conducting during each static state of the input signal. The switching accelerator is responsive to the input stage for generating a short period signal to accelerate the logic state switching of the latch stage and thereby improve the response of the output signal to a change in an input signal logic state change.

BRIEF DESCRIPTION OF THE DRAWINGS

These and other attendant advantages and features of the present invention will become readily appreciated upon consideration of the following detailed description of the invention when considered in conjunction with the accompanying drawings, wherein like reference numerals designate like parts throughout the figures thereof, and wherein:

FIG. 3 is a schematic diagram illustrating another embodiment of the present invention.

DETAILED DESCRIPTION OF THE INVENTION

Figure 1:
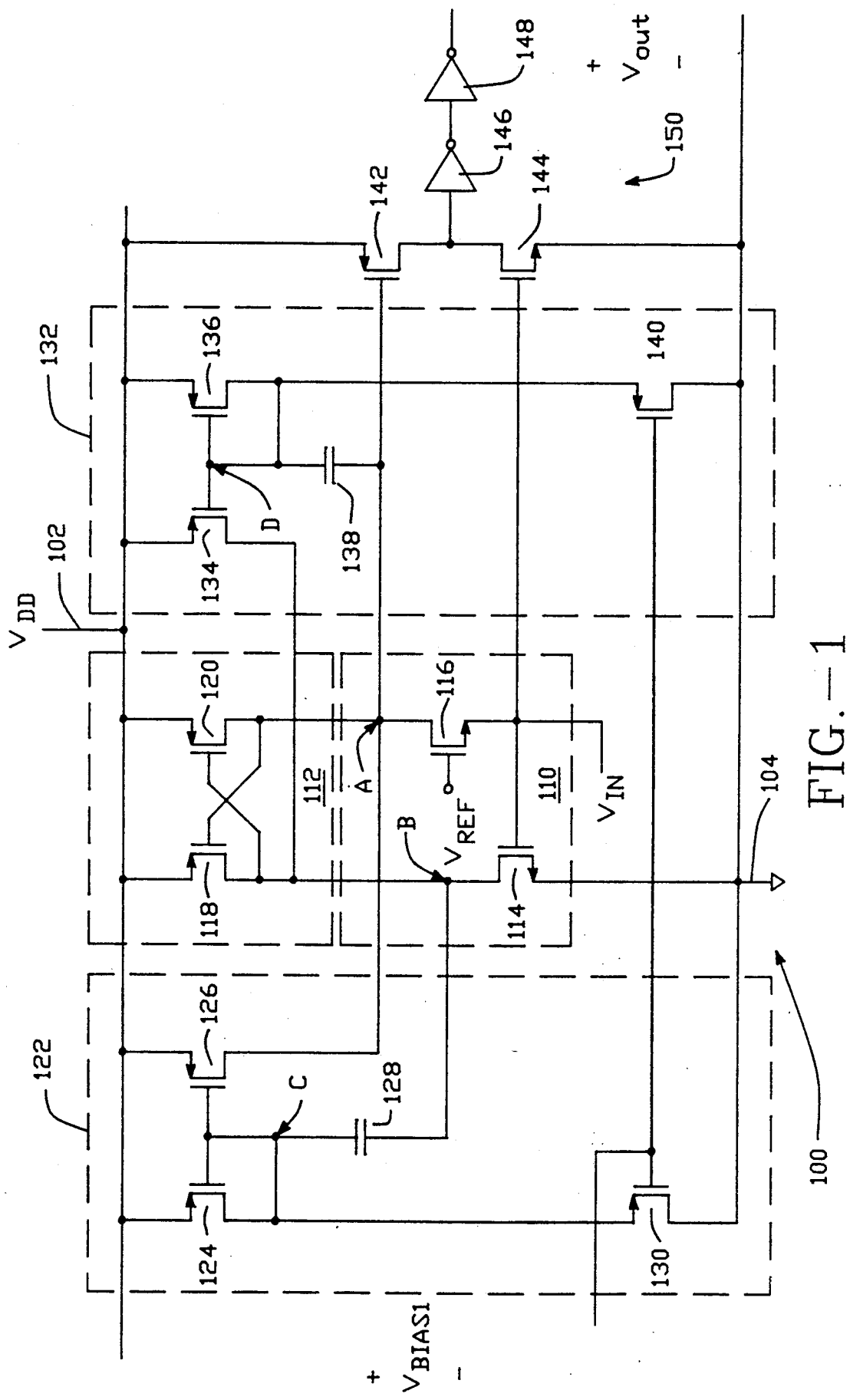
FIG. 1 is a schematic diagram illustrating a first embodiment of the present invention.

FIG. 1 provides a schematic diagram of a circuit 100 embodying the present invention. The circuit 100 is connected to a power supply between a $V_{DD}$ terminal 102 and a ground terminal 104. The circuit 100 includes a buffer having an input stage 110 and a latching stage 112. The input stage 110 includes two N-channel FETs 114, 116. The FETs 114, 116 each receive an input signal, $V_{in}$. The input signal $V_{in}$ is applied to the gate of FET 114 and to the source of FET 116. The source of FET 114 is connected to the ground terminal 102. The gate of FET 116 is coupled to a reference voltage, $V_{ref}$. This reference voltage $V_{ref}$ is set to a potential between the logic levels of the input signal $V_{in}$. These logic levels are predetermined for each logic family. For the TTL logic family, a logical zero state is defined as any potential between 0 and 0.7 volts while a logical one state is any potential above 2.4 volts. To obtain TTL logic family compatibility, a reference voltage $V_{ref}$ between one and three volts may be used. In general, the minimum value of the reference voltage $V_{ref}$ is an FET threshold voltage, $V_T$, higher than the maximum voltage level defining the low logic state of $V_{in}$.

The latching stage 112 includes two P-channel FETs 118 and 120. The FETs 118 and 114 form a first current path through a Node B. The FETs 120 and 116 form a second current path through a Node A. The FETs 118 and 120 are cross-coupled, with the gate of FET 120 connected to the drain of FET 118 and the gate of FET 118 connected to the drain of FET 120 to create a bi-stable, regenerative state latch. Thus, the latching stage 112 effectively operates as a latching load for the input stage 110. That is, the latch state of the latch stage 112 will follow the relative state of Node A and B. However, the latch state will change only after FET 114 is substantially on or off in response to the input signal $V_{in}$.

In order to improve the responsiveness of the buffer 110, 112 to changes in the logic state of the input voltage $V_{in}$, switching accelerator blocks 122 and 132 are provided. Block 122 includes two P-channel FETs 124, 126 configured as a conventional current mirror. Specifically, the sources of the FETs 124, 126 are coupled to the $V_{DD}$ terminal 102 and the gates of FETs 124, 126 are commonly connected to the drain of FET 124. A P-channel FET 130 is coupled between the drain of FET 124 and the ground terminal 104 to current through the current mirror FETs 124, 126. The current level through FET 130 is, in turn, controlled by a bias potential $V_{bias1}$, relative to the $V_{DD}$ potential, applied to the gate of FET 130. Finally, the drain of FET 124 is coupled through a capacitor 128 to Node A of the buffer 110, 112 and the drain of FET 126 is coupled directly to Node B.

Block 132 similarly includes two current mirror connected P-channel FETs 134, 136 and a mirror current control FET 140. The drains of FETs 134, 136 are coupled through capacitor 138 and directly to Nodes A and B, respectively. The gate of P-channel FET 140 is also biased at the bias potential $V_{bias1}$.

Coupled to the buffer 110, 112 is an output driver stage 150 that includes a P-channel FET 142 coupled in series with a N-channel FET 144. The gate of FET 142 is connected to Node A to receive the effective output voltage of the buffer stage 110, 112. The gate of FET 144 is connected to receive the input signal $V_{in}$ (effectively, the complement of the output voltage of the buffer stage 110, 112). An output voltage, $V_{out}$, for the circuit 100 is thus provided by the output driver stage 150 from a point between FETs 142 and 144 and further current buffered by invertors 146 and 148.

For proper operation, when the logic level of $V_{in}$ is at or below the maximum low logic state voltage level (0 volts +$V_{ref}$−$V_T$ volts), the FET 116 is switched on (conductive) and FET 114 is switched off (non-conductive). As a result, the voltage at the drain of FET 114 (Node B) will be at the high logic state voltage level to ($V_{ref}$ to $V_{DD}$). Because the gate of FET 120 is connected to Node B, the FET 120 will switch off and the voltage at Node A will be latched at the low logic state level. Since the gate of FET 118 is connected to Node A, the FET 118 will then switch on due to the regenerative action of the latch stage 112. In this static operational state, since there is a non-conducting FET in each current path, the buffer 110, 112 obtains substantially zero power dissipation.

When the logic level of $V_{in}$ subsequently transitions to the high logic state voltage level, the FET 116 is switched off and the FET 114 is switched on. As a result, the voltage at Node B will be low and FET 118 will be switched on. The voltage at Node A will be therefore high and FET 118 will be switched off. Again, since FETs 118, 120 are non-conducting, the buffer 110 obtains substantially zero power dissipation.

However, when $V_{in}$ transitions from the high to low logic state, FET 116 must turn on and be capable of pulling the gate of FET 118 (Node A) substantially to ground and turning FET 118 on, thereby initiating the regenerative operation of the latch stage 112 resulting in the forced switching off of FET 120. Similarly, when $V_{in}$ transitions from the low to high logic state, FET 114 must turn on and be capable of pulling down the voltage at Node B sufficient to force the latch stage 112 to switch off FET 118.

In accordance with the preferred embodiments of the present invention, the channel width-to-length ratio (W/L) of FET 114 is made larger than that of FET 118. The resultant greater current conduction capability of FET 114, relative to FET 118, allows FET 114 to force down the voltage at Node B once FET 114 is switched on and independent of whether the FET 118 is simultaneously switched on. The channel width-to-length ratio of FET 116 is also made larger than that of FET 120 to ensure that FET 116 is capable of pulling down Node A when FET 116 is switched on.

Because FETs 118, 120 have a smaller W/L ratio relative to FETs 113, 114, the charging current to either Node A and Node B will be small. The charging current is applied through FETs 118, 120 whenever FETs 114, 116, respectively, are switched off. The available charging current is defined by the equation:

$$I_{charge} = \mu C_{ox}/2 \ (W/L)(V_{gs} - V_T)$$

where 1 is channel mobility, $C_{ox}$ is oxide capacitance, W/L is the width to length ratio of the FET 118, 120 $V_{gs}$ is the gate-to-source potential of the FET 118, 120, and $V_T$ in the gate threshold voltage of the FET 118, 120. Consequently, the Nodes A and B will be charged slowly.

To increase the charging speed of the Nodes A and B, the accelerator blocks 122 and 132 are provided. Considering the operation of accelerator block 122 as exemplary of both blocks 122, 132, the current mirror FETs 124, 126 are off at a steady state. The coupling, capacitor 128 connected to Node B of buffer 110, 112 will have been charged to the steady state voltage difference between Nodes A and B ($vV_{AB}$). The common voltage of the drains and gates of FETs 124, 126 will rise up to $V_{DD} - V_{Tp}/2$, where $V_{Tp}$ is the gate threshold voltage of the P-channel FETs 124, 126, once the coupling capacitor 128 becomes fully charged.

When $V_{in}$ subsequently transitions from low to high logic state, Node B will change from high to low by $vV_{AB}$ volts. This change $vV_{AB}$ of the voltage at Node B will be transferred to the gates of FETs 124, 126 (Node C) through the coupling capacitor 128. As a result, the voltage at Node C will be changed by $vV_B$ volts. The voltage $vV_B$ is related to $vV_{AB}$ by the equation:

$$vV_B = vV_{AB} [C_{128}/(C_{128} + C_p)]$$

where $C_p$ is the parasitic capacitance associated with Node C.

When the $vV_B$ voltage is applied to the gate of FET 126 the FETs 124, 126 are both switched on. FET 126 therefore conducts an accelerator charge current is charge current to Node A defined by the equation:

$$I_{126} = 1 C_{ox}/2 \ (W/L)_{126} [(vV_B) - V_{Tp}]^2$$

where 1 is channel mobility, $C_{ox}$ is oxide capacitance, W/L is the width to length ratio of the FET 118, 120 $V_{gs}$ is the gate-to-source potential of the FET 118, 120, and $V_{Tp}$ is the gate threshold voltage of the P-channel FETs 118, 120.

At the same time FET 124 begins charging capacitor 128. As the capacitor 128 charges, the charge current $I_{126}$ begins to deteriorate. The charge time of capacitor 128 is quite fast given the preference for a very low capacitor value consistent with the present invention. That is, the value of capacitor 128 is chosen so that its charge time is less than the maximum switching frequency of the input signal $V_{in}$. Even with extremely fast charge times for capacitor 128, FET 124 is able to deliver a substantial charging current to Node C so as to pull Node C back to $V_{DD} - (V_{Tp}/2)$ and thereby turn off FET 126. FET 130 biases Node C to $V_{Tp}/2$. Consequently, FET 126 will cut off and clamp Node C below $V_{DD}$ as capacitor 128 is charged up, thereby ensuring that latch-up cannot occur.

The operation of blocks 122 and 132 can also be understood by referring to an application entitled "Logic Level Discriminator" which is incorporated herewith by reference.

Figure 2:
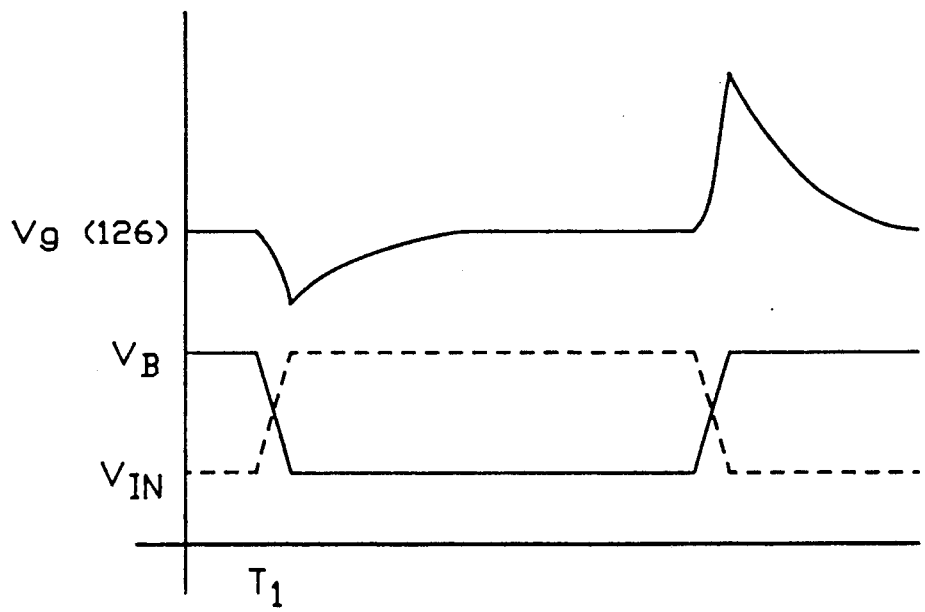
FIG. 2 is a voltage-vs-time graph illustrating the relationship between an input signal and the voltage at the common control terminal of the circuit of FIG. 1.

FIG. 2 is a timing diagram which depicts the relationship between the input signal $V_{in}$, the voltage (VB) at Node B, and the voltage $V_g(126)$ at the gate of FET 126 (also Node C). In operation, the current passing through FET 126 is determined by the gate voltage $V_g(126)$. At static state (that is, when $V_{in}$ is not switching), the gate voltage of FET 126 is equal to $V_{DD} - (V_{Tp}/2)$, where $V_{Tp}$ is the gate threshold voltage of the P-channel FET 124.

Assume that $V_{in}$ switches from a low level to a high level at time T1. The voltage $V_B$, at Node B will change from a high level to a low level. Because the gate of FET 126 is coupled to Node B through the capacitor 128, the gate voltage of FET 126 will be pulled down from its static potential to a value of $vV_B$. Accordingly, FET 126 turns on.

When the gate voltage of FET 126 is pulled below $V_{DD}-V_T$, a current ($I_{126}$) will pass from $V_{DD}$ through FET 126 to the output Node B to accelerate the response of the buffer 110, 112. This current, however, will deteriorate as the gate voltage of FET 126 increases toward $V_{DD}$ in response to capacitor 128 being recharged by FET 124.

FIG. 3 illustrates another embodiment, generally indicated by the reference numeral 160, of the present invention that substantially incorporates the circuit 100 of FIG. 1. In addition to the circuit 100, a block 168 is provided to prevent punch-through breakdown of FETs 114, 116 and 144 at high power supply voltages. Circuit 168 includes a first N-channel FET 162 that is coupled between FETs 114 and 118, a second N-channel FET 164 coupled between FETs 116 and 120, and a third FET 166 coupled between FETs 142 and 144. The gates of FETs 162, 164 and 166 are connected in common to a second constant bias voltage $V_{bias2}$.

By the presence of the circuit block 168, the voltage at the drain of FET 114 will be clamped to a maximum value of $V_{bias2}-V_{gs}(162)$, the voltage at the drain of FET 116 will be clamped to a maximum value of $V_{bias2}-V_{gs}(164)$, and the voltage at the drain of FET 144 is clamped to a maximum value of $V_{bias2}-V_{gs}(166)$.

Figure 4:
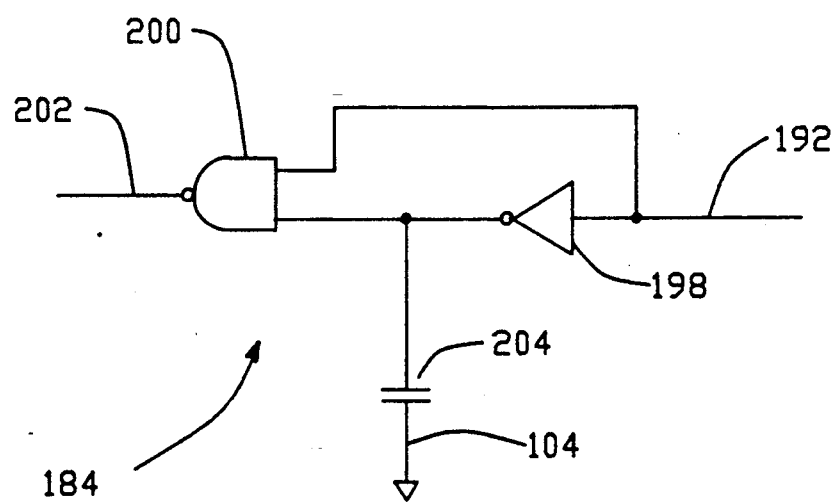
FIG. 4 is a schematic diagram of a simple one-shot circuit as used in preferred embodiments of the present invention.

Also included in the circuit of FIG. 3 are subcircuits 180 and 186. These subcircuits 180, 186 are used to further speed the recharging time of the capacitors 128 and 138 so that gates of FET 126 and FET 136 can return to $V_{DD}-(V_{Tp}/2)$ even at high frequency operation. The subcircuit 180 includes a P-channel FET 182 providing a conduction path from the $V_{DD}$ power supply terminal 102 to the common gate of FETs 124, 126. The gate of FET 182 is driven by to a one-shot circuit 184. The input of the one-shot circuit is controlled by the voltage potential outlet Node E. An exemplary one shot circuit, consistent with the present invention is shown in FIG. 4. The one-shot 184 includes an invertor 198 and NAND gate 200. The line 192 is the input to the invertor 198 and one of the two inputs to the NAND gate 200. The output from the invertor 198 is delayed by the charging time of a capacitor 204 before being provided as the second input to the NAND gate 200. As should be readily apparent, the output of the NAND gate 200 remains at a logic one state except when there is a logic zero to one state transition on the input line 192. On such a transition, the state of the output line 202 transitions to a logic zero for that period of time for the charge stored by the capacitor 204 to be drawn off by the invertor 198.

The subcircuit 186 similarly provides a one-shot 190 controlled conduction path from the power supply terminal 102 to the common gates of FET 134, 136 via FET 186. The one-shot circuit 190 is controlled by the voltage potential at Node F.

Circuits 180 and 186 are used to further accelerate the return of the voltage at the gates of FETs 124, 126, and of FETs 134, 236, respectively, back to $V_{DD}-(V_{Tp}/2)$ after changes in logic state by $V_{in}$.

By way of example, consider Node C subcircuit 180. After Node C is pulled down as $V_{in}$ switches from low to high, Node C will be returned to $V_{DD}-(V_{Tp}/2)$ by FET 124 with a longer than necessary time constant of $gm_{124}/C_{128}$ absent the operation of subcircuit 180. Therefore, in high frequency operation (for example, at or above 10 MHz), Node C will not have enough time to return to and settle at $V_{DD}-V_{Tp}/2$ before $V_{in}$ changes logic state again. Disadvantageously, this will limit the transient response speed because FET 126 is not completely off. However, with subcircuit 180 and similarly subcircuit 186, the Nodes C and D will be recharged quickly.

The following tables gives an exemplary set of values of the components of circuit 160 as shown in FIG. 4. All dimensions are in micrometers.

TABLE 1

| FET | Type | W/L | FET | Type | W/L |
|---|---|---|---|---|---|
| 130 | P-Channel | 150/4 | 144 | N-Channel | 1500/4 |
| 124 | P-Channel | 10/4 | 151 | P-Channel | 150/4 |
| 126 | P-Channel | 800/4 | 222 | P-Channel | 10/4 |
| 118 | P-Channel | 5/20 | 221 | P-Channel | 800/4 |
| 120 | P-Channel | 5/20 | 223 | P-Channel | 150/4 |
| 134 | N-Channel | 1500/4 | 141 | N-Channel | 15/10 |
| 136 | N-Channel | 1500/4 | 143 | N-Channel | 15/10 |
| 114 | N-Channel | 1500/4 | 140 | P-Channel | 20/4 |
| 142 | P-Channel | 2000/4 | 142 | P-Channel | 20/4 |
| 140 | N-Channel | 1500/4 | | | |

TABLE 2

| | | | |
|---|---|---|---|
| $V_{DD}-V_{bias1}=$ | 1 volt | $C_{128}=$ | 9 pf |
| $V_{bias2}=$ | 10 volt | $C_{138}=$ | 3 pf |
| $V_{ref}=$ | 2.1 volt | $C_{204}=$ | 0.5 pf |

The voltage $V_{ref}$ can be generated by a conventional voltage reference or, as in the preferred embodiments of the present invention, by the circuit described in application entitled "CMOS Compatible Bandgap Voltage Reference", Ser. No. 07/264,360, and assigned to the assignee of the present invention. With the exemplary values provided in Tables 1 and 2, the input switching threshold, $V_{th}$ of the buffer is 1.7 volts. For TTL compatibility, the maximum input switching threshold, $V_{thmax}$ is 2.4 volts.

The foregoing disclosure and discussion of the present invention provides a broad teaching of the principles of the present invention such that many modifications and variations thereof will be readily apparent to persons of average skill in the art. One such modification is the substitution of PNP for NPN bipolar transistors, P-channel for N-channel transistors and N-channels for P-channel transistors with the corresponding changes in power source potentials. Therefore, it is understood that, within the scope of the appended claims, the invention may be practiced otherwise than as specifically described.

What is claimed is:

1. A circuit for providing a high-speed translation between first and second sets of logic signals, said circuit comprising:
    a) means for buffering an input signal of the first set, said buffering means including means, responsive to said input signal, for comparing said input signal to a reference voltage and latch means, responsive to said comparing means, for latching a logic state corresponding to the logic state of said input signal relative to said reference voltage;
    b) means, responsive to the logic state latched by said latch means, for providing a output signal of said second set; and
    c) means, directly responsive to said comparing means, for accelerating the switching of said latch means in latching at least one logic state corresponding to a logic state of said input signal relative to said reference voltage.

2. The circuit of claim 1 wherein said comparing means determines a logic state of said input signal by voltage comparison to said reference voltage, said comparing means providing a compare result signal indicative of whether said input signal is greater than said reference voltage plus a first predetermined voltage or less than said reference voltage less a second predetermined voltage, and wherein said latch means is responsive to the logic state of said compare result signal.

3. The circuit of claim 2 wherein said accelerating means is responsive to said compare result signal and wherein said accelerating means provides a rapidly deteriorating current pulse to said latch means to enhance the responsiveness of said latch means to said compare result signal.

4. The circuit of claim 3 wherein said accelerating means includes an acceleration circuit that is coupled through a capacitor to said compare result signal, wherein said accelerating means includes a current mirror having a control input and a current output where the voltage at the control input controls the level of current provided through the current output, wherein said control input provides a current path for the charging and discharging of said capacitor sufficient to charge or discharge said capacitor prior to a next change in the logic state of said input signal.

5. The circuit of claim 4 wherein comparison means further provides a second compare result signal, said accelerating means includes first and second acceleration circuits responsive to said compare result signal and said second compare result signal, respectively, for enhancing the responsiveness of said latch means in switching from a first logic state to a second logic state and from said second logic state to said first logic state.

6. The circuit of claim 5 wherein said latch means is a bistable latch having first and second latch inputs, wherein said compare means provides said compare result signal to said first latch input and said second compare result signal to said second latch input, and wherein said current output of said first accelerator circuit is coupled to said second latch input and said second accelerator circuit is coupled to said first latch input.

7. A circuit for changing the logic state of an output signal in response to a change in the logic state of an input signal, said circuit comprising:
 a) a buffer, including:
  i) input means receiving the input signal, the input means having first and second transistors coupled to switch complementarily in direct response to the input signal; and
  ii) latching means for providing a load to the input means, said latching means comprising third and fourth transistors mutually coupled to form a bistable latch, the third and fourth transistors establishing first and second current paths, respectively, the first and second transistors being coupled in series at first and second nodes with the first and second current paths, respectively; and
 b) a switching accelerator, responsive to the voltage at said first node, for providing a rapidly deteriorating surge current to said second node to accelerate the response of the latching means to the input means.

8. The circuit of claim 7 wherein the switching accelerator is capacitively coupled to the first node and wherein the deterioration of the surge current corresponds to the charging of a capacitor coupled to the first node.

9. The circuit of claim 8, wherein the switching accelerator includes an accelerator circuit having fifth and sixth transistors coupled in a current mirror configuration with a control input and a current output, wherein the current provided through the current output is proportional to the voltage provided at the control input, and having a capacitor coupled between the first node and the control input, the current output being coupled to the second node.

10. The circuit of claim 9 wherein the control input of the accelerator circuit further provides for charging and discharging the capacitor means after each change in the logic state of the input signal.

11. The circuit of claim 10 wherein the accelerator circuit further includes a one-shot current pulse circuit having an output coupled to said control input for reducing the time to charge the capacitor after each change of a predetermined direction in the logic state of the input signal.

12. A high-speed buffer for receiving an input signal varying between logic states of a first logic set and for providing an output signal of a corresponding logic state of a second logic set, said buffer operating between first and second supply rails, said buffer comprising:
 a) a bistable latch including first and second FETs coupled to provide first and second current paths between said first supply rail and first and second nodes, respectively, the gate of the first FET being coupled to said second node and the gate of the second FET being coupled to said first node;
 b) an input circuit including third and fourth FETs respectively coupled to said first and second nodes, said third FET completing the first current path to said second supply rail and the fourth FET providing a current path between said second node and the gate of the third FET, the gate of the third FET receiving said input signal and the gate of the fourth FET receiving a reference voltage;
 c) an output circuit including fifth and sixth FETs coupled in series at a third node to provide a third current path between said first and second supply rails, the gate of said fifth FET coupled to said second node and the gate of said sixth FET coupled to said first node, the third node providing the output signal; and
 d) an accelerator circuit including seventh and eighth FETs coupled to said first supply rail to provide fourth and fifth current paths respectively, a ninth FET being coupled in series with said seventh FET at a fourth node to complete said fourth current path to said second supply rail, the gates of said seventh and eighth FETs being coupled together, coupled to said fourth node and through a capacitor to said first node, the gate of said ninth FET receiving a bias voltage relative to said first supply rail, the fifth current path being provided through said eighth FET to said second node.

13. The buffer of claim 12 further comprising means, responsive to said output signal, for providing a short duration current pulse to said fourth node to charge said capacitor immediately following a change in the logic state of said output signal.

14. The buffer of claim 13 further comprising a second accelerator circuit including tenth and eleventh FETs coupled to said first supply rail to provide sixth and seventh current paths respectively, a twelfth FET being coupled in series with said tenth FET at a fifth node to complete said sixth current path to said second supply rail, the gates of said tenth and eleventh FETs being coupled together, coupled to said fifth node and through a second capacitor to said second node, the gate of said twelfth FET receiving said bias voltage, the seventh current path being provided through said eleventh FET to said second node.

15. The buffer of claim 14 further comprising second means, responsive to said output signal, for providing a short duration current pulse to said fifth node to charge said second capacitor immediately following a change in the logic state of said output signal.

16. The buffer of claim 15 further comprising a clamp circuit including thirteenth, fourteenth, and fifteenth FETs, said thirteenth FET interposed in the current path between said first node and said third FET, said fourteenth FET interposed in the current path between said second node and said fourth FET, and said fifteenth FET interposed in the current path between said third node and said sixth FET, the gates of said thirteenth, fourteenth, and fifteenth FETs being coupled in common for receiving a second bias voltage.

* * * * *